(12) United States Patent
Zhang et al.

(10) Patent No.: US 6,608,847 B2
(45) Date of Patent: Aug. 19, 2003

(54) TUNABLE LASER WITH SUPPRESSION OF SPONTANEOUS EMISSION

(75) Inventors: Guangzhi Z. Zhang, San Jose, CA (US); Andrew Davidson, Mountain View, CA (US); David Robinson, Cupertino, CA (US); Carter Hand, Los Altos, CA (US); Mark Wippich, Campbell, CA (US); Murray Reed, Menlo Park, CA (US); Weizhi Wang, San Jose, CA (US)

(73) Assignee: New Focus, Inc., San Jose, CA (US)

( * ) Notice: Subject to any disclaimer, the term of this patent is extended or adjusted under 35 U.S.C. 154(b) by 63 days.

(21) Appl. No.: 09/967,885

(22) Filed: Sep. 28, 2001

(65) Prior Publication Data

US 2003/0063633 A1 Apr. 3, 2003

(51) Int. Cl.[7] .................................................. H01S 3/10
(52) U.S. Cl. .............................. 372/20; 372/98; 372/92; 372/99; 372/9
(58) Field of Search ............................. 372/92, 98, 99, 372/20, 9

(56) References Cited

U.S. PATENT DOCUMENTS

| | | | | |
|---|---|---|---|---|
| 5,121,398 A | * | 6/1992 | Rao | 372/20 |
| 5,245,626 A | * | 9/1993 | Burke et al. | 372/92 |
| 5,263,043 A | * | 11/1993 | Walsh | 372/102 |
| 5,418,803 A | * | 5/1995 | Zhiglinsky et al. | 372/23 |
| 6,038,239 A | * | 3/2000 | Gabbert | 372/20 |
| 2001/0040910 A1 | * | 11/2001 | Zhang et al. | 372/102 |
| 2003/0063633 A1 | * | 4/2003 | Zhang et al. | 372/20 |

* cited by examiner

Primary Examiner—Leon Scott, Jr.
(74) Attorney, Agent, or Firm—Alan W. Cannon

(57) ABSTRACT

A laser apparatus and method with compact cavity design that provides suppression of source spontaneous emission (SSE) and amplified spontaneous emission (ASE) light with minimal loss. The laser comprises a gain medium emitting a light beam along an optical path, a tuning element positioned in the optical path and configured feed back light of a selected wavelength to the gain medium and configured to define a first output beam directed along a first output path, a partial reflector located in the optical path and positioned to create a second output beam directed along a second output path substantially parallel to the first output path; and having a spontaneous emission component that is spatially separated from the selected wavelength. The second output beam can be coupled into optical fiber and produce a coherent light source with high spectral purity and tunable wavelengths.

45 Claims, 7 Drawing Sheets

TUNABLE LASER WITH SUPPRESSION OF SPONTANEOUS EMISSION

BACKGROUND OF THE INVENTION

Frequency tunable semiconductor diode lasers provide versatile optical tools for telecommunications, metrology, spectroscopy and other uses. Many such tunable lasers use a diffraction grating with a movable reflector to select a desired wavelength from the beam diffracted by the grating. A diode gain medium is employed that has an antireflection (AR) coating on one facet thereof. Light emitted from the AR coated facet is diffracted by a grating and directed to a movable reflector, which feeds light back to the grating and gain medium. Rotation of the reflector selects the wavelength diffracted by the grating and allows the laser to be tuned to a desired output wavelength. Translational motion of the reflector is frequently employed in conjunction with the rotational motion to couple the cavity optical path length to the selected wavelength and provide mode-hop free tuning. Grating-tuned external cavity lasers are typically arranged in the Littman-Metcalf configuration with a "folded cavity", which permits compact-sized external cavity laser devices suitable for many commercial uses.

The optical output of grating-tuned external cavity lasers of this sort may be collected as the light emitted from a rear, partially reflective facet of the gain medium, or as the grating reflection of light directly from the gain medium. This provides a relatively high output power, but includes "noise" in the form of source spontaneous emission (SSE) and amplified spontaneous emission (ASE) from the gain medium. One approach to providing a spectrally "clean" output from grating-tuned external cavity lasers has been to simply insert a beam coupler directly into the laser cavity between the grating and gain medium. A partially reflective surface on the beam coupler directs a portion of the light returning from the grating outside the cavity. This partially reflected light is at the selected wavelength and has been spatially separated from the propagation direction of the spontaneous emission light by the grating. This spectrally clean output may then be coupled into a fiber for use in applications requiring high spectral purity.

This relatively simple approach to providing a spectrally pure output beam has some important drawbacks. One of the attractive features of folded cavity lasers is the small or compact size that is possible for commercial lasers. Directing optical output outside of the folded cavity results in a substantial increase in the overall size and complexity of the external cavity laser device. Further, the introduction of a beam coupler into the laser cavity results in a significant intracavity optical loss. The insertion of a beam coupler into the laser cavity always results in the extra optical loss from the opposite reflection off the partially reflective surface of the beam coupler from the spectrally cleaned light that is collected and use. The spectral cleansing provided by beam couplers thus is obtained with a corresponding sacrifice in laser output power.

There is a need for an external cavity laser apparatus that provides suppression of spontaneous emission light from laser output, that is simple and compact in design, which provides high laser output power, and which collects loss components associated with spectral cleaning as usable laser outputs. The present invention satisfies these needs, as well as others, and overcomes the deficiencies found in the background art.

SUMMARY

The invention provides a laser apparatus and method with compact cavity design that provides suppression of source spontaneous emission (SSE) and amplified spontaneous emission (ASE) light with minimal intracavity loss. The apparatus comprises a gain medium emitting a light beam along an optical path, a tuning element positioned in the optical path and configured feed back light of a selected wavelength to the gain medium and configured to define a first output beam directed along a first output path, a partial reflector located in the optical path and positioned to create a second output beam directed along a second output path substantially parallel to the first output path; and having a spontaneous emission component that is spatially separated from the selected wavelength.

By way of example, and not of limitation, the apparatus may further comprise an optical fiber positioned with respect to the second output path such that light at the selected wavelength is selectively received by or coupled into the optical fiber. A reflector may be positioned in the optical path after the tuning element to define an external laser cavity with a facet of the gain medium. The reflector may be movable with respect to the tuning element to define the selected wavelength. The tuning element may comprise a grating, an etalon, an interference filter, or other optical element or capable of providing wavelength selection.

In certain embodiments, the apparatus may comprise a beam coupler positioned in the optical path, with the partial reflector located on a facet of the beam coupler. The beam coupler may further comprise an antireflection coating on one or more facets that are opposite from the partial reflector on the beam coupler. In certain embodiments, the beam coupler may be configured to define a third output beam traveling a third output path that is substantially parallel to the first and second output paths.

By way of further example, the external cavity of the apparatus, in some embodiments, has a folded external cavity design and comprises a reflective rear facet on the gain medium and a reflector positioned in the optical path after the tuning element, wherein the reflector and a rear facet of the gain medium define the external laser cavity. The tuning element comprises a tuning grating capable of selecting a specific wavelength for output from the external cavity. The external cavity is folded with respect to the tuning grating, and the reflector is movable with respect to the grating to provide wavelength selection. A first output beam is reflected from the tuning grating along a first output path, and contains noise associated with source spontaneous emission (SSE) and/or amplified spontaneous emission (ASE) associated with current pumping of the gain medium.

A beam coupler, which may comprise a simple optical flat with a partially reflective surface and an anti-reflection-coated surface, is positioned in the optical path between the gain medium and the tuning grating. The beam coupler is positioned in the optical path to receive light diffracted from the tuning grating and to reflect a portion of this light out of the external cavity as a second output beam along a second output path that is substantially or approximately parallel to the first output path. The second output beam comprises a portion of the light diffracted from the tuning-grating toward the gain medium, and which is intercepted or picked off by the beam coupler before the light can be fed back to or otherwise return to the gain medium. The beam coupler may, in certain embodiments, have a wedge or prism configuration.

In the second output beam, the spontaneous emission light generated in the gain medium has been spatially separated from light at the selected wavelength by operation of the tuning grating, and has dispersion characteristics for generating a low-noise output. The second output beam is coupled to an optical fiber positioned and configured to selectively receive the light at the tuned or selected wavelength, and to selectively exclude light associated with spontaneous emission. Since the second output path is substantially or approximately parallel to the first output path, coupling of the both the first and second output beams into fibers can be achieved without sacrificing the overall compact size of the external cavity laser apparatus. This arrangement of the output paths allows for ease of alignment and detection of either the first or second output beam from the laser apparatus.

In certain embodiments, the beam coupler may be configured to provide a third output beam along a third output path. The third output beam takes advantage of the reflection of the direct output beam from the gain medium off the partial reflector in the beam coupler, which would otherwise be uncollected and result in optical loss. The apparatus may be configured so that the third output path is substantially parallel to the first and second output paths. The third output beam is of relatively high power output power compared to the second output beam, but contains SSE or ASE noise components that have not been spatially separated from the selected wavelength.

In still other embodiments, a portion of an output beam or beams may be directed to an external diffraction grating or optical filtering devices. The incidence of the beam on the diffraction grating will spread or spatially separate the selected wavelength from the noise or spontaneous emission background and direct the selected wavelength to coupling optics. A portion of the beam directed to the coupling optics is picked off and directed to a quadcell detector, a linear array detector, or other detector. Output from the detector is provided to a controller that is operatively coupled to the grating and is configured to tune the grating in a manner that optimizes coupling of the output beam into the coupling optics. The orientation of the fiber optical axis, together with the spatial filtering or separation provided by the grating, provide for filtering of spontaneous emission components from the light coupled into the fiber. The controller tunes the tuning element according to feedback from the detector to keep the grating tuned or oriented for optimum coupling of the output beam into the optical fiber.

The methods of the invention comprise, in general terms, emitting a light beam from a gain medium along an optical path, feeding light of a selected wavelength back to the gain medium by a tuning element positioned in the optical path, forming or creating a first output beam that is directed along a first output path, creating or forming a second output beam directed along a second output path parallel to the first output path, and spatially separating spontaneous emission light from light of the selected wavelength in the second output beam.

The subject methods may further comprise coupling the second output beam into an optical fiber positioned to selectively receive the selected wavelength and exclude spontaneous emission light. Creating the second output path may comprise positioning a partial mirror in the optical path between the tuning element and gain medium. The methods may additionally comprise defining an external laser cavity by placing a reflector in the optical path after the tuning element, with the external cavity defined by the reflector and a facet of the gain medium. Positioning the partial mirror in the optical path may comprise positioning a beam coupler in the optical path, with the partial reflector located on a facet of the beam coupler. The methods may still further comprise creating a third output beam by the beam coupler, with the third output beam traveling along a third output path parallel to the first and second output paths.

The invention provides a tunable external cavity with a compact or folded design that produces a continuously tunable output with extremely low noise from source spontaneous emission (SSE) and amplified spontaneous emission (ASE). The apparatus and methods of the invention can be utilized in the testing, measurement and evaluation of optical systems, WDM, DWDM, EDFA, fiber network, optical passive components, metrology, spectroscopy, industrial process monitoring, optical analytical instrumentation and Raman spectroscopy. The invention further provides a laser apparatus that generates multiple-beam outputs of frequency tunable coherent light sources with both a low noise, SSE and ASE-suppressed beam and one or more high output power beams without ASE and SSE suppression. The invention further provides for use of cavity loss as effective laser output and allows for multiple laser light output sources to be accessed from a single unit. With the output path of the light beam with reduced SSE or ASE positioned to be substantially parallel to the primary output beam, the laser apparatus can take advantage of the compact size offered by the inventive cavity configurations.

BRIEF DESCRIPTION OF THE DRAWINGS

The invention will be more fully understood by reference to the following drawings, which are for illustrative purposes only.

DETAILED DESCRIPTION OF THE INVENTION

Referring more specifically to the drawings, for illustrative purposes the present invention is embodied in the apparatus shown in FIG. 1 through FIG. 8. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also to be understood that the terminology used herein is for the purpose of describing particular embodiments only, and is not intended to be limiting, since the scope of the present invention will be limited only by the appended claims.

Figure 1:
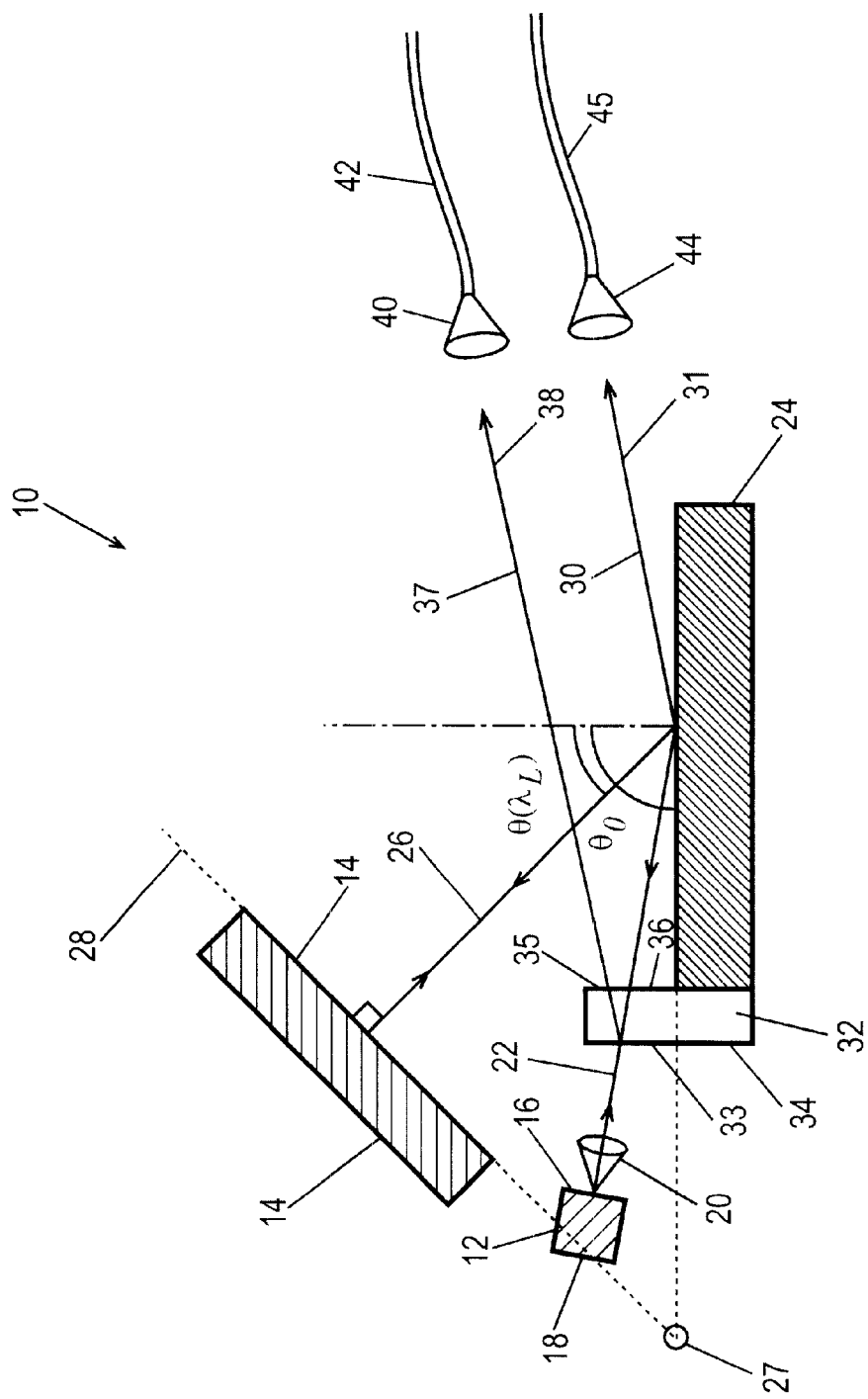
FIG. 1 is a schematic illustration of an external cavity laser apparatus in accordance with the invention with a grating used in reflection as a tuning element.

Referring now to FIG. 1, there is shown external cavity laser apparatus 10 in accordance with the invention. The apparatus 10 includes a gain medium 12 and an end or external reflective element or retroreflector 14. Gain medium 12 may comprise a conventional Fabry-Perot diode emitter chip and has an anti-reflection (AR) coated front output facet 16 and a reflective or partially reflective rear output facet 18. The external laser cavity is defined or delineated by rear facet 18 and end reflector 14. Gain medium 12 emits a coherent beam from front facet 16 that is collimated by lens 20 and directed along an optical path 22 to a tuning element that is shown in FIG. 1 as a diffraction tuning element or tuning-grating 24. Other types of tuning element may be used with the invention, as described further below. Light diffracted from tuning-grating 24 travels along optical path 26 to the end reflector 14, which reflects light back to tuning-grating 24. Tuning-grating 24 returns the light reflected off end reflector 14 along optical path 22 to gain medium 12. The arrangement of gain medium 12, tuning-grating 24 and end reflector 54 result in a "folded cavity" having an optical cavity path length equal to the sum of optical paths 22, 26.

End reflector 14 is mounted on a movable arm (not shown) that pivotally moves with respect to a pivot point 27 such that the angular relationship of the plane 28 is defined by the reflective surface of reflector 14. The diffraction received by reflector 14 from grating 24 is varied by pivotal movement of reflector 14 with respect to pivot point 27. Angular motion of end reflector 14 with respect to tuning-grating 24 in this manner results in changing the particular diffraction that is received by reflector 14 from grating 24 and which is then reflected back to grating 24 and hence to gain medium 12. The angular motion of reflector 14 with respect to grating 24 thus allows tuning or adjusting the wavelength that is fed back into gain medium 12 to provide a selected output wavelength.

Movement of end reflector 14 with respect to pivot point 27 results in both angular and translational motion of end reflector 14, and the location of pivot point 27 and positioning of end reflector 14 with respect to pivot point 27 may be selected to couple optical cavity length adjustment to wavelength selection to provide mode-hop free optical output. A variety of conventional translation or positional adjustment systems may be used for the movement of end reflector 14 with respect to grating 24. Such systems may utilize, for example, a stepper motor to physically drive the pivot arm supporting reflector 14, a linear encoder and/or motor rotational encoder to track movement of the pivot arm, and a control device to selectively control the positioning of the pivot arm and reflector 14.

Optical output of the external cavity laser apparatus 10 may be collected as a first or primary output beam 30 along a first output path 31 that is the grating reflection of light directly from the gain medium 12. Output beam 30 provides conventional output that in some cases has relatively high power from the external cavity laser 10, but includes "noise" in the form of source spontaneous emission (SSE) and amplified spontaneous emission (ASE) from the gain medium 12. The SSE and ASE result in a spontaneous emission component in the output beam 30 in the form of low intensity incoherent light that is delivered along output path 31 together with coherent light at the wavelength selected according to the positional relationship of reflector 14 and grating 24.

Laser apparatus 10 further includes a beam coupler 32 positioned in optical path 22 between gain medium 12 and tuning-grating 24. Beam coupler 32 includes a partially reflective surface or partial reflector 33 on one facet 34, and has an anti-reflective coating 35 on a facet 36 that opposes or is opposite facet 34 on beam coupler 32. Partial reflector 33 may comprise a metallized layer, a dielectric stack, a simple interface of dielectric materials, or any other surface that allows partial transmission and partial reflection of light traveling therethrough. The degree or percent of reflectivity or transmittance may be varied as desired in different embodiments of the invention. The anti-reflection coating 35 may comprise a singe dielectric layer or multi-layer dielectric film of dielectric materials of selected refractive indices and thicknesses have been selected to minimize reflection and promote transmission for light of a selected wavelength or wavelengths incident on facet 36.

Partial reflector 33 picks off a portion of the light returning from the tuning-grating 24 towards gain medium 12, and directs this light outside the external cavity as a second output beam 37 traveling along a second output path 38. Beam coupler 32 and partial reflector 33 are positioned and configured such that the second path 38 is generally parallel to the first output path 30 defined by the grating reflection of the output from gain medium 12. The term "parallel" as used herein means substantially or approximately parallel, as well as precisely parallel.

In the output beam 37 traveling second output path 38, the laser light at the selected wavelength defined by the positional relationship of reflector 14 and grating 24 has been spatially or angularly separated from the propagation direction of the spontaneous emission output component by the action of grating 24. The output beam 37 is directed through a collimating lens 40, which focuses beam 37 into an optical fiber 42. Optical fiber 42 is positioned and configured to selectively receive only light at the selected wavelength. The spontaneous emission light component, which is slightly divergent from the selected wavelength light along output path 38, is excluded from optical fiber 42. In other words, the optical axis of fiber 42 is oriented so that fiber 42 only accepts light at the selected wavelength defined by the positional relationship of reflector 14 and grating 24, and the limited receiving aperture of the fiber effectively cuts off the spontaneous emission component of output beam 37. The spatial filtering provided by the orientation of the fiber 42, and the dispersion provided by grating 24 thus allow the output beam 38 to be "cleansed" with respect to the ASE and SSE light components. Various other elements (not shown) may be employed in association with the coupling of output 38 into optical fiber 42, including optical isolators, coarse filters, polarizing optics, additionally collimating optics, and like elements.

The output beam 30 traveling path 31 may also be focused by a lens 44 into an optical fiber 45. The substantially parallel orientation of first output path 30 and second output path 38 allows for either output beam to be conveniently used as a laser source, while maintaining a compact design for laser apparatus 10. That is, both the high power output beam 30 and spontaneous emission-suppressed beam 37 exit the laser cavity in the same direction, and the compact device size provided by the Littman-Metcalf external cavity configuration is preserved.

In the embodiment shown in FIG. 1, beam coupler 32 is positioned adjacent to grating 24, and may be joined to grating 24. In other embodiments, beam coupler 32 may be positioned separately from grating 24. In all embodiments, beam coupler 32 is positioned such that partial reflector 33 picks off a portion of light wherein the ASE and/or SSE components have been spatially separated from the light of the selected wavelength by the action of grating 24. A variety of beam coupler positions and configurations allow this arrangement. Positioning the beam coupler 32 in the optical path 22 as shown to pick off light returning from grating 24 towards gain medium provides a simple way of generating an output beam 37 in which ASE and/or SSE components have been spatially separated from the selected wavelength light. Beam coupler 32, in some embodiments, may be positioned in optical path 26 and configured to pick off a portion of light diffracted from grating 24 towards reflector 14.

Figure 2:
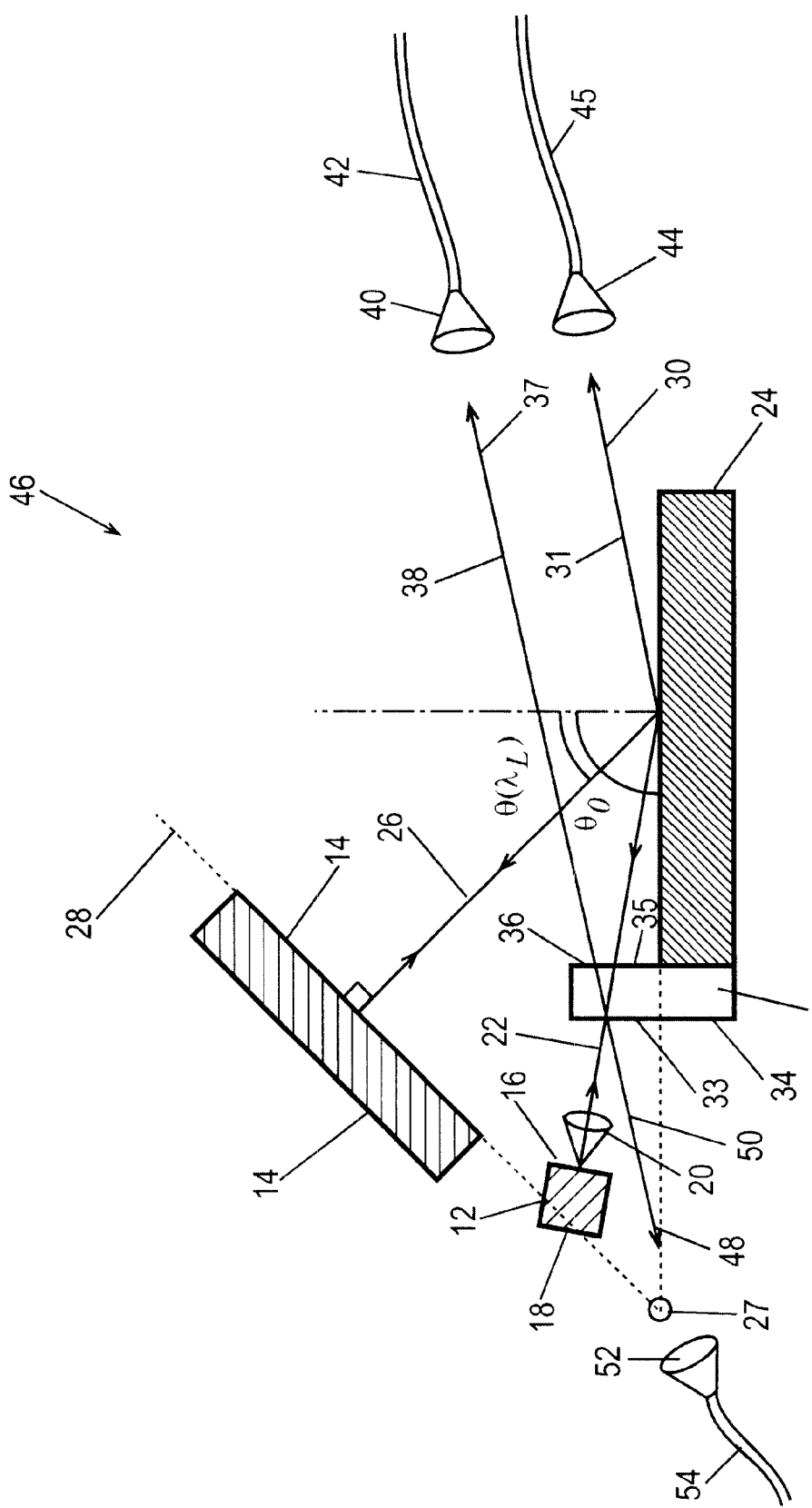
FIG. 2 is a schematic illustration of an alternative embodiment of an external cavity laser apparatus in accordance with the invention with a grating used in reflection as a tuning element.

Referring now to FIG. 2, there is shown an alternative embodiment laser apparatus 46 in accordance with the invention, wherein like reference numbers are used to denote like parts. Partial reflector 33 on beam coupler 32 is used to pick off a portion of light returning from grating 24 towards gain medium 12 as described above, to create an output beam 30 on path 31 with a spontaneous emission component that is spatially separated from the selected wavelength light. Partial reflector 33, by its nature, also picks off or reflects a portion of the light emitted from facet 16 of gain medium 12 towards grating 24, which is shown in FIG. 2 as a third output beam 48 traveling along output path 50. In the embodiment of FIG. 1, this light from the gain medium 12 that is reflected along path 50 is lost. In the embodiment of FIG. 2, the output 48 traveling path 50 is collimated by lens 52 into an optical fiber 54. In this manner, a substantial portion of the optical loss that would otherwise be associated with positioning beam coupler 32 in optical path 22 is recovered as usable output.

The output beam 48 traveling output path 50 can represent a substantial portion of the overall optical power deliverable by the apparatus 46, depending upon the degree of reflectivity of partial reflector 33. The light along path 48 thus provides a usable output from the laser apparatus 46 for many applications. Output path 50 is parallel to the output paths 31, 37 described above. In the embodiment of FIG. 2, however, the direction of output beam 48 is in a direction that is substantially the opposite of output beams 30, 38. Since output beam 48 is picked off from optical path 22 as light exiting gain medium 12, output beam 48 includes ASE and SSE components which have not been spatially separated from the selected wavelength defined by the positional relationship of grating 24 and reflector 14.

Figure 3:
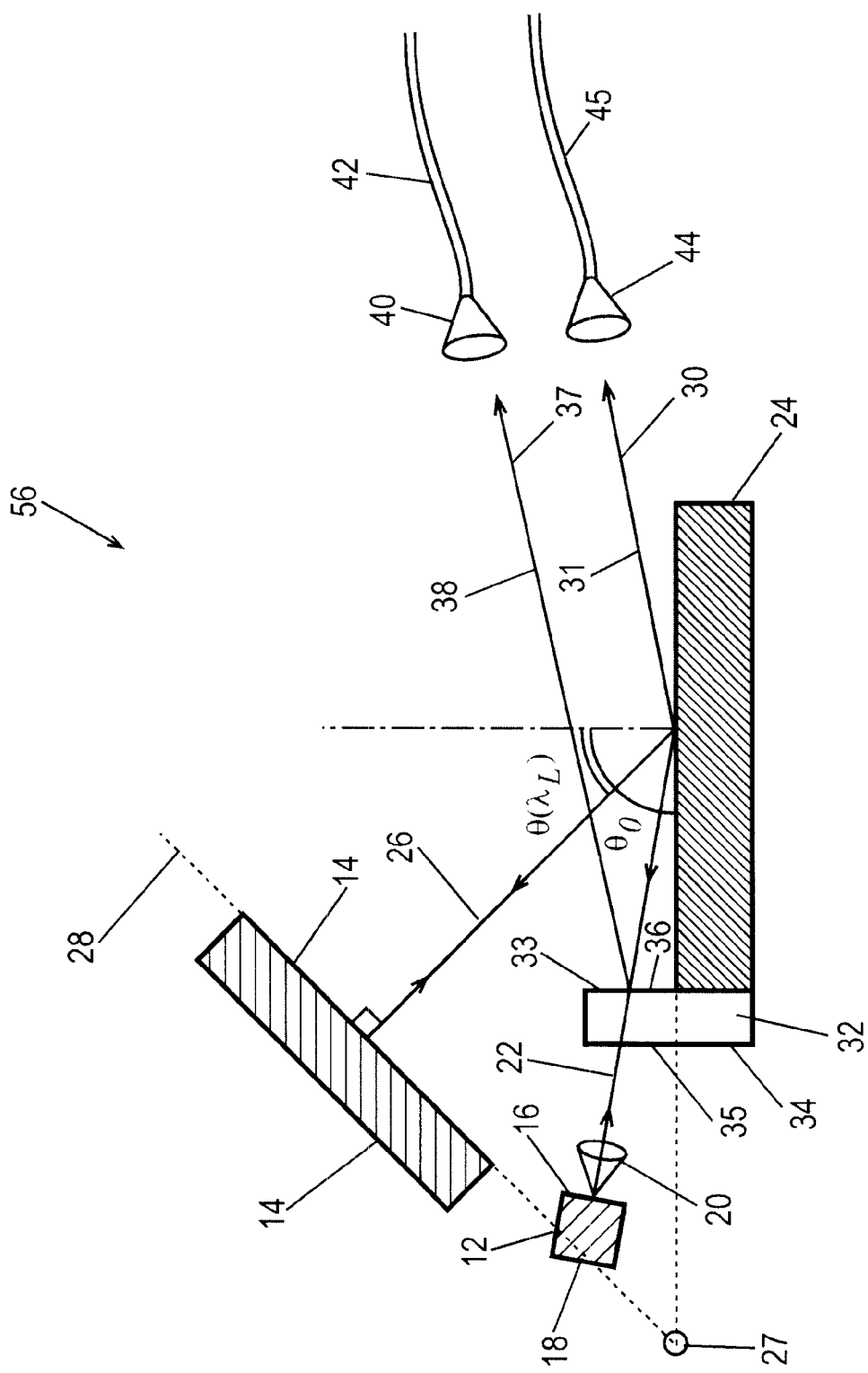
FIG. 3 is a schematic illustration of another embodiment of an external cavity laser apparatus in accordance with the invention with a grating used in reflection as a tuning element.

Referring next to FIG. 3, there is shown another embodiment laser apparatus 56 in accordance with the invention, wherein like reference numbers are used to denote like parts. In the apparatus 56, the partial reflector 33 is located on facet 36 of beam coupler 32, rather than on facet 34. Antireflection coating 35 accordingly is located on facet 34 of beam coupler 32. In the embodiment of FIG. 3, the pick off point in optical path 22 provided by partial reflector 33 is thus located closer to grating 24 than in the apparatus 10 shown in FIG. 1. The output 30 directed along output path 31 has ASE and SSE components that have been spatially or angularly separated from the selected wavelength by action of grating 24 as described above. The apparatus 56 operates in generally the same manner as the apparatus 10 described above. In laser apparatus 56, the direct reflection (not shown) of the output from gain medium off partial reflector may also be used as an optical output in the manner shown regarding output 48 in FIG. 2.

Figure 4:
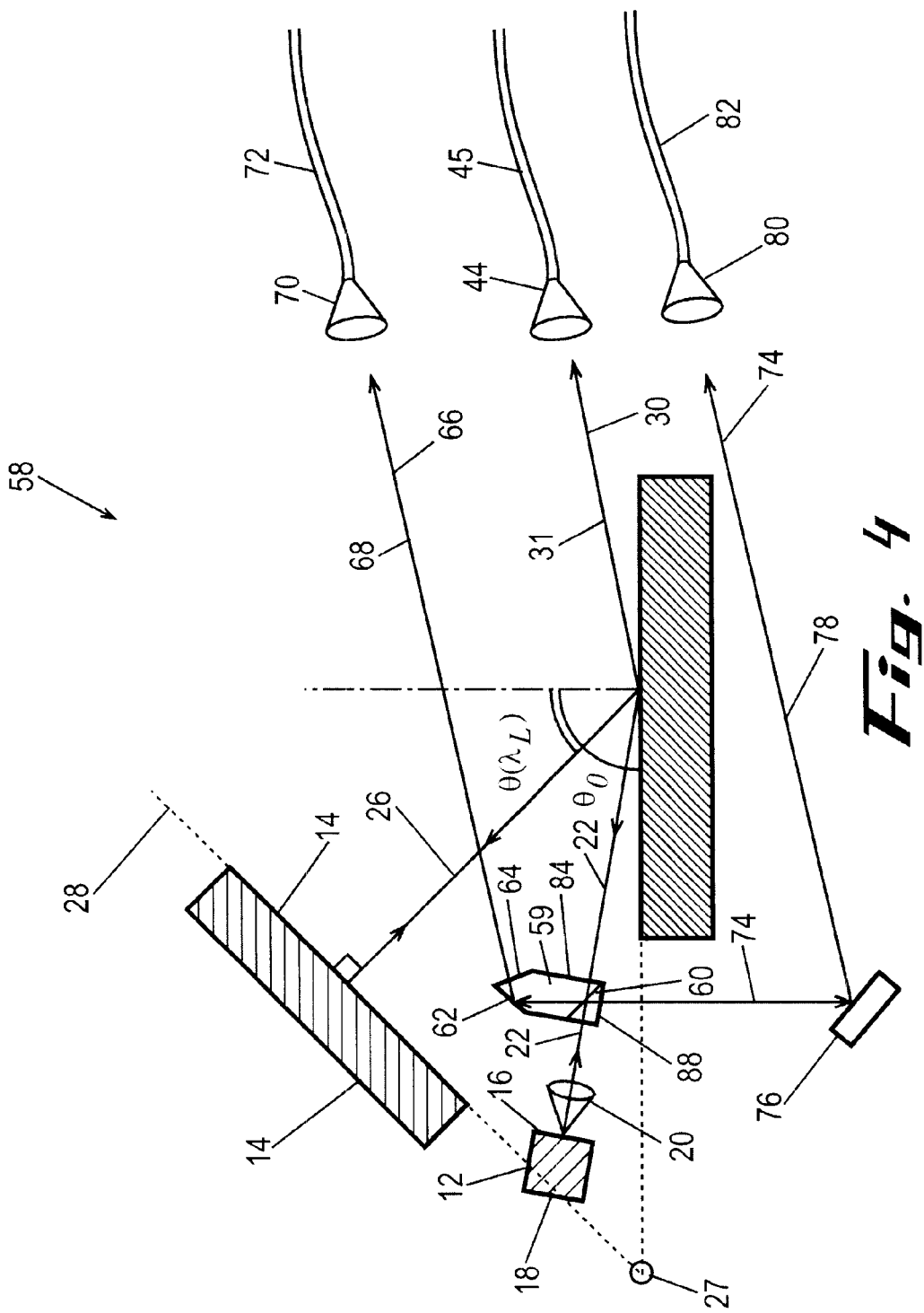
FIG. 4 is a schematic illustration of another embodiment of an external cavity laser apparatus in accordance with the invention with a grating used in reflection as a tuning element.

Referring now to FIG. 4, there is shown another embodiment of an external cavity laser 58, wherein like reference numbers denote like parts. In this embodiment, beam coupler 59 includes an internal partial reflector 60 positioned in optical path 22 to pick off a portion of light returning from grating 24 towards gain medium 12. Light reflected by partial reflector 60 is directed to a reflective surface 62 on beam coupler 59, which internally reflects this light through facet 64 as an optical output 66 along an output path 68.

In the output beam 66 traveling path 68, the laser light at the selected wavelength defined by the positional relationship of reflector 14 and grating 24 has been spatially or angularly separated from the propagation direction of the ASE and SSE components by the action of grating 24 as described above, and output beam 66 thus provides a source of light in which the ASE and SSE components can be suppressed. Output beam 66 is directed through a collimating lens 70, which focuses beam 66 into an optical fiber 72 that is positioned and configured to selectively receive only light at the selected wavelength and not the spontaneous emission light components, which are slightly divergent from the selected wavelength light along output path 38 due to the action of grating 24.

The output path 68 is substantially parallel in orientation to the first output path 31 defined by the reflection of the output from gain medium 12 off grating 24. The apparatus 58 thus provides dual, parallel outputs 30, 66. The parallel relationship of output paths 68, 31 allows both the high power output beam 30 on path 31, and the output beam 66 with spatially separated ASE and SSE components along path 68, to be conveniently used as light sources for various applications. The parallel relationship of output paths 31, 68 provides a compact design for laser apparatus 58 and allows a simple, compact packaging of the apparatus 58.

The partial reflector 60 of beam coupler 59 also picks off a portion of the light traveling along optical path 22 from facet 16 of gain medium 12 towards grating 24. This light is directed as output 74 to reflector 76, which in turn the output 74 along output path 78 to a collimator 80, which focuses the optical output from path 78 into an optical fiber 82. The direction of output 74 along path 78 and the coupling of output 74 into fiber 82 takes advantage of light that would otherwise be a reflection loss from partial reflector 60, and converts that light in useful output 74. Since optical output 74 is intercepted from optical path 22 directly from gain medium 12, the ASE and SSE components present in output 74 are not spatially separated from the selected wavelength.

Output path 78 is substantially or approximately parallel to output paths 31 and 68, and the laser apparatus 58 thus conveniently provides three parallel outputs from a relatively compact apparatus. The apparatus 58 is similar to the apparatus 46 shown in FIG. 2, except that the third output beam 74 is co-directional with the first and second output beams 30, 66, while in the apparatus 46, the third output beam 48 travels in an opposing direction to the other output beams.

Beam coupler 59 as shown in FIG. 4 is configured that the light of beam 66 is internally reflected off surface 62 and exits beam coupler 59 through exit surface 62. The output path 68 of beam 66 is perpendicular to exit surface 62 to minimize deflection by material dispersion at exit surface 62 and to simplify the alignment of the light along second output path 68 into optical fiber 72. This configuration allows for stable and constant coupling of the low-noise laser beam 66 into optical fiber 72 while the laser apparatus 58 is tuned across the entire gain bandwidth of gain medium 12.

Beam coupler 59 may be configured and positioned in a variety of ways to define output paths 68, 78 that are parallel to each other and to output path 31. In the embodiment shown in FIG. 4, beam coupler 59 may include antireflection coatings (not shown) on facets 64, 84, 86 and 88 to minimize optical losses associated with the creation of output beams 66, 74. In other embodiments, beam coupler 59 may be suitably positioned in optical path 26 and configured to have a partial reflector that picks off a portion of light returning from reflector 14 towards grating 24, and directs this picked off light along an output path that is parallel to the output path 31 defined by the reflection of output from gain medium 12 off grating 24.

Figure 5:
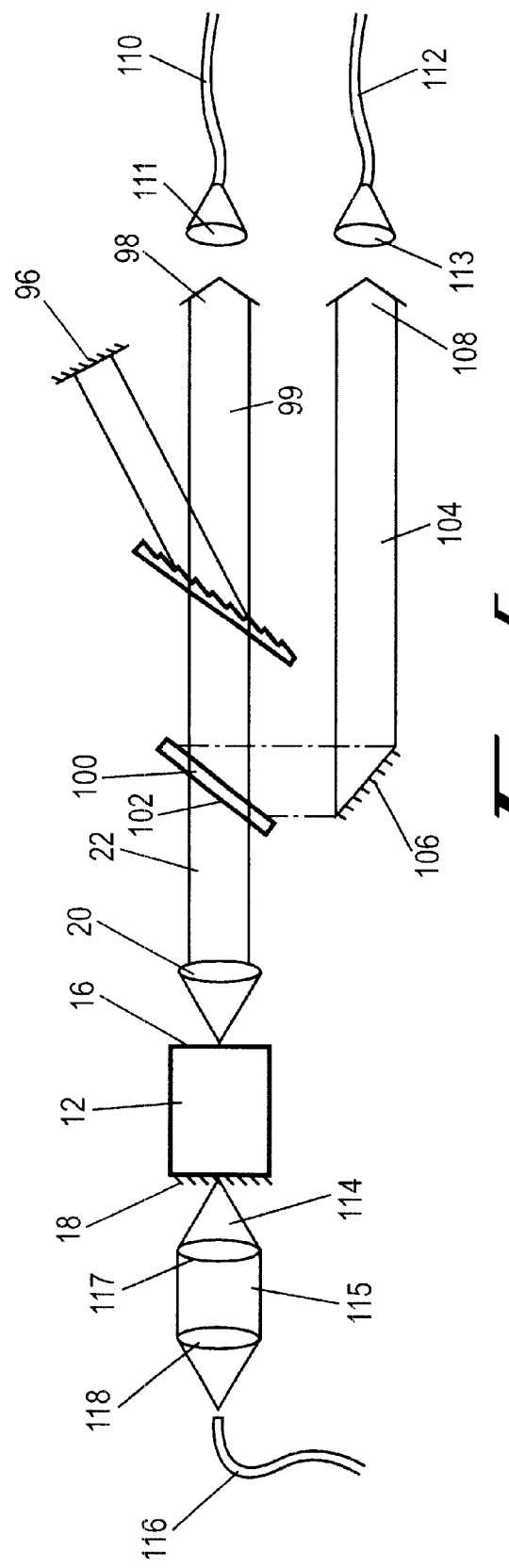
FIG. 5 is a schematic illustration of another embodiment of an external cavity laser apparatus in accordance with the invention with a grating used in transmission as a tuning element.

Referring next to FIG. 5, another embodiment laser apparatus 90 is shown, with like reference numbers used to denote like parts. In the apparatus 90, a beam is emitted from facet 16 of gain medium 12, which travels along optical path 22 to a grating 92. Grating 92 is movable about a pivot point 94 by a suitable positional adjustment system to allow selection of the diffraction that is returned from grating 92 to gain medium 12, and thus provides for tuning or wavelength selection of the light fed back to gain medium 12 by angular positioning of grating 92. Grating 92 is transmissive or partially transmissive, and a portion of the light traveling optical path 22 is diffracted by grating towards an end mirror or reflector 96 that, together with facet 18 of gain medium 12, defines an external laser cavity such that reflector 96 returns light to gain medium 12 through grating 92 along path 22. A portion of the light traveling optical path 22 from gain medium 12 is transmitted through grating 92 as a first optical output 98 traveling output path 99.

A beam coupler 100 is positioned in optical path 22 between grating 92 and gain medium 12. Beam coupler 100 includes a partially reflective pick off surface 102 that intercepts a portion of the light diffracted from grating 92 that is returned towards gain medium 12 by end reflector 96. Partially reflective surface 102 directs this light as a second optical output 104 to reflector 106 that directs the output 104 along a second output path 108 that is parallel to the first output path 99.

The second output 104 is intercepted from optical path 22 as the diffraction off grating 92 before this diffraction has returned to gain medium 12, and the ASE and SSE components present in output 104 thus are spatially separated from the selected wavelength defined by the position of grating 92. The first output 98 includes light from gain medium 12 that has been transmitted through grating 92 and not diffracted, and thus has ASE and SSE components that are not spatially separated from the selected wavelength are present in the first output exiting end reflector 96.

The first and second output paths 99, 108 are parallel to each other, and allow the apparatus 90 to provide dual optical outputs from a relatively compact configuration. The first output beam 98 is coupled into an optical fiber 110 via lens 111, and the second output beam 108 is coupled into fiber 112 via lens 113. First optical output 98 provides a relatively high optical power, albeit with ASE and SSE components present in the output. In the case of second output 104, the optical fiber 112 is positioned and configured to selectively receive only light at the selected wavelength defined by the position of grating 92. The spontaneous emission light components, which are slightly divergent from the selected wavelength light along output path 108, are excluded from optical fiber 112 due to the selective orientation of the optical axis of fiber 112 such that the limited fiber receiving aperture effectively cuts off the spontaneous emission components.

In the apparatus 90, the direction of second output 108 could be varied by 180° from the direction shown by re-positioning reflector 106. In such an arrangement, output paths 99, 108 remain parallel, but with output beams 98, 104 traveling in opposite directions. Facet 18 of gain medium 18 may be made partially reflective so that a third output beam 114 is emitted from facet 18 of gain medium 12 along a third output path 115 and coupled into a fiber 116 by lenses 117, 118. Output path 115 is parallel to output paths 104, 99, but with output beam 114 traveling in a direction opposite to output beams 98, 108. In still other embodiments, end reflector 96 may be partially reflective such that an additional output beam (not shown) exits the external cavity through reflector 96.

Various other external cavity laser arrangements that can employ the inventive features disclosed herein will suggest themselves to those skilled in the art upon review of this disclosure, and are considered to be within the scope of this disclosure. Various types of gratings used in transmission or reflection may be used, and the gratings may be a transmission grating, and may be chirped or un-chirped in different embodiments.

Figure 6:
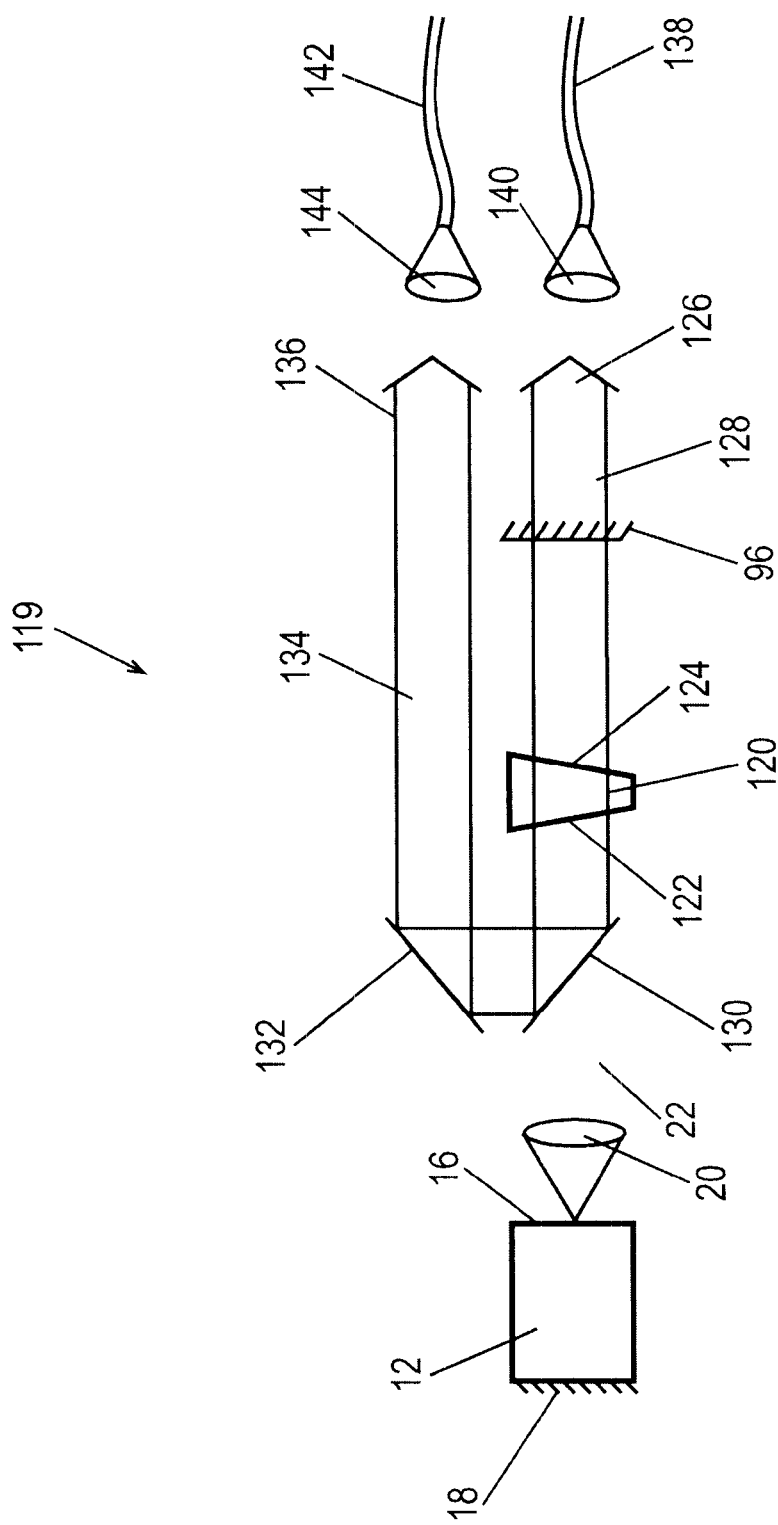
FIG. 6 is a schematic illustration of another embodiment of an external cavity laser apparatus in accordance with the invention with a tilted etalon as a tuning element.

The apparatus and methods of the invention may employ tuning elements other than grating devices that provide for wavelength selection as well as separation of spontaneous emission light from light of the selected wavelength. Referring to FIG. 6, there is shown yet another embodiment laser apparatus 119 in accordance with the invention, with like reference numbers used to denote like parts, wherein an etalon 120 is used as a tuning element. In the apparatus 119, facet 16 of gain medium 12 emits a beam along optical path 22 to etalon 92. Etalon 120 is tapered in shape and acts as an interference filter that selectively feeds light of a selected wavelength back to gain medium 12. Etalon 120 includes first and second faces 122, 124 that are each partially reflective and partially transmissive, so that a portion of light from gain medium 12 passes through etalon 120, and a portion of light from gain medium 12 is returned to gain medium 12 by reflection from surfaces 122, 124. An end mirror or reflector 96, together with facet 18 of gain medium 12, defines an external laser cavity. End reflector 96 is partially reflective, and a portion of the light traveling path 22 exits the external cavity through reflector 96 as a first optical output 126 along output path 128.

Etalon 120 may comprise a solid or gas-filled etalon, an air gap etalon, an etalon comprising an electro-optic material, or a thin film interference filter. Various types of etalon tuning elements, as well as grating tuning elements, that are usable with the invention are described in U.S. patent application Ser. No. 09/814,646 entitled "Error Signal Generation System" to inventor Andrew Daiber, filed on Mar. 21, 2001, the disclosure of which is incorporated herein by reference. Etalon 120 is tunable by various mechanisms using translation and/or rotation of etalon 120 and/or application of voltage across etalon 120 as described in application Ser. No. 09/814,646. Etalon 120 is structured and configured to impart a spatial separation to the ASE and SSE light components, from the selected wavelength, in the light that is returned towards gain medium 12 from etalon 120. A partial reflector 130, which may be associated with a beam splitter or beam coupler (not shown), is positioned in optical path and picks off a portion of the light returning from etalon 120 to gain medium 12, and directs this intercepted light to reflector 132 and hence along a second output path 134 as a second optical output 134.

The first and second output paths 128, 134 are parallel to each other, and allow the apparatus to provide dual optical outputs from a relatively compact configuration. The first output 126 is coupled into an optical fiber 138 via lens 140, and the second output 136 is coupled into fiber 142 via lens 144. First optical output 126 provides a relatively high optical power output with portions of ASE and SSE components present, as described above. In the second optical output 136, ASE and SSE components are spatially separated from the selected wavelength by the operation of the interference filter nature of etalon 120 on output beam 136, and optical fiber 142 is suitably positioned and configured to selectively receive only light at the selected wavelength defined by the position of etalon 120, while the spontaneous emission light components, which are slightly divergent from the selected wavelength light along output path 134, are excluded from optical fiber 142 due to the orientation of the optical axis of fiber 142 and the fiber entrance aperture.

In the apparatus 119, the direction of either the first or second output beams 126, 136, or both may be reversed or altered by 180° as noted above, while preserving the parallel relationship of output paths 134, 128. In some embodiments, one of the faces 122, 124 of the etalon 120 may be used as a pick off point for the second output beam with spatially separated ASE and SSE components. Such embodiments of the invention are useful in far-field applications. In still other embodiments, facet 18 of gain medium 12 may be partially reflective to provide a third output beam along a parallel output path as described above for the apparatus 90 in FIG. 5.

The degree of reflectivity of end reflector 96 in the apparatus 119 of FIG. 6 may be varied to vary the relative power of output beams 126, 136. Thus, for example, in certain embodiments reflector 96 can be completely reflective or almost completely reflective such that most or all of the output power of the apparatus 119 is provided to output beam 136 along output path 134.

Figure 7:
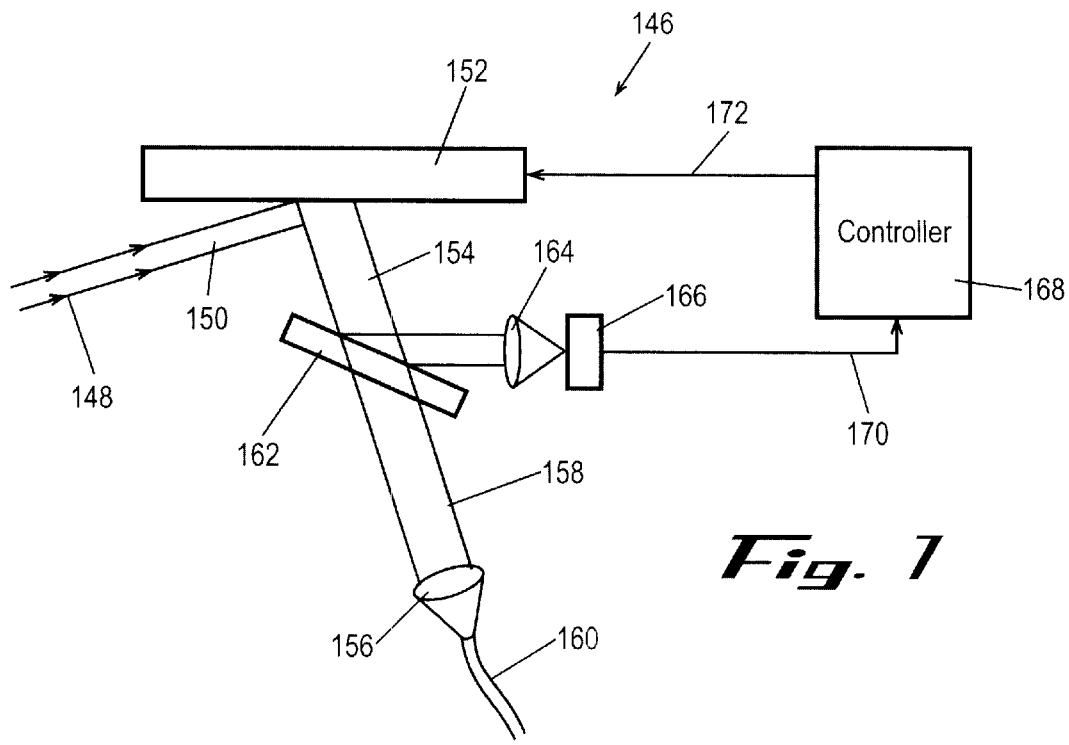
FIG. 7 is a schematic illustration of another embodiment of an external cavity laser apparatus in accordance with the invention with a control system to optimize coupling of ASE and SSE-filtered laser output into an optical fiber.

Referring next to FIG. 7, there is shown yet another embodiment of a laser apparatus 146 in accordance with the invention. In the apparatus 146, a beam 148 from a tunable laser source is directed along an optical path 150 to diffraction grating 152 or like tuning element. Grating 152 has a high first order diffraction efficiency, and a portion of beam 148 is diffracted from grating 152 as a first order diffraction. This diffraction from grating 152 travels along an output path 154 to a collimator that focuses the optical output 158 from output path 154 into an optical fiber 160. The apparatus 146 provides a filtering system or assembly for removal of ASE and SSE components from a laser output beam.

A beam coupler or beam splitter 162 is positioned in output path 154 and picks off a portion of the light traveling output path 154. The picked off light is focused by lens 164 onto a light-beam position detector 166, which may comprise a split detector, a quadcell sensor, a linear array of light of sensors, or other sensor or sensor array capable of detecting movement of a focused beam spot with respect to a sensor surface. Detector 166 is operatively coupled to a controller 168 via communication interface 170. Detector 166 generates a voltage output regarding the position detected for output beam 158 according to the location of the corresponding beam spot focused onto detector 166. The voltage signal is communicated to controller 168, and is indicative of the maximum or optimum coupling of light into the fiber 160 according to the detected offset of the beam spot from the detector center.

Controller 168 is operatively coupled to the grating 152 by a tuning mechanism or assembly through an interface 172 schematically shown in 146. Interface 172 may comprise conventional rotational or translational positioning hardware (not shown) that is operable according to instruction from controller 168 for positioning of grating 152. Controller 168 and interface 172 thus are configured to positionally adjust grating 152 according to signals from detector 166 in order to maintain optimal coupling of output beam 158 into fiber 160.

Input beam 148 may comprise, for example, the first output beam 31 from the laser apparatus 10, or the first output beam from the various other embodiment laser apparatus described above. Thus, the apparatus 146 may be operatively coupled to the external cavity laser apparatus 10 such that the output beam 31 of apparatus 10 provides input beam 148 for the apparatus 146 of FIG. 7. In this regard, input beam 148 includes unfiltered ASE and SSE components, together with coherent light at a selected wavelength. The dispersive effect of grating 152 imparts a spatial separation to the different wavelength components of input beam 148, such that ASE and SSE components present in the output beam 158 diffracted from grating 152 are spatially separated from the selected wavelength present in input beam 148 from the tunable source of beam 148. Optical fiber 160 is oriented to receive the selected wavelength from output beam 158 while selectively rejecting the spatially separated ASE and SSE light components.

A change in the wavelength of input beam 148 due to wavelength selection by the tunable laser source of input beam 148, will result in a directional change in the first order diffraction off grating 152 that provides output beam 158. That is, the angular relationship of output path 154 with respect to grating 152 changes with respect to change in wavelength of the light of input beam 148. Change in the direction of output path 154 is detected by detector 166, which detects spatial changes in location of the beam spot focused onto detector 166 by lens 164. Detector 166, upon detection of a change in output beam 158, sends corresponding voltage signal to controller 168. The voltage signal is used as an error signal for the re-positioning of grating 152, and grating 152 is pivoted or otherwise moved so that the first order diffraction off grating remains optimally oriented with respect to fiber 160 for effective coupling of light of the selected wavelength into fiber 160.

Detector 166, controller 168 and grating 152 thus act in a closed-loop servo system wherein a change in the selected wavelength of light of input beam 148 is detected by detector 166 and communicated to controller 168, which in turn re-positions grating according to the change in wavelength in input beam 148 so that this selected wavelength, as diffracted from grating 152 along path 154, is optimally coupled into optical fiber 160 while the spontaneous emission components are rejected by the entrance aperture of fiber 160. The tunable range is determined by the working range of grating 152, and can be selected for various wavelength ranges. The overall system insertion loss for the selected wavelength into fiber 160 is determined by the efficiency of grating 152, beam pick off losses associated with beam coupler 162, and the coupling efficiency of fiber 160, which can be lower than 2 dB for a single mode fiber. Antireflection coatings (not shown) may be used in association with the non-reflective surface(s) of beam coupler 162. Higher order diffractions from grating 152 other than first order may be also utilized for coupling into fiber 160.

The apparatus 146 can be used together with any of the laser apparatus 10, 46, 56, 58, 90 or 118 described above and shown in FIG. 1 through FIG. 6. The apparatus 146 is positioned and configured with the corresponding laser apparatus such that the primary output beam of the laser apparatus is oriented as the input beam 148 in the apparatus 146. Thus, in the case of apparatus 10, the grating 152 in FIG. 7 generates a third output beam from the output 31 of laser 10 wherein the ASE and SSE components are spatially separated from the selected wavelength by the action of grating 152. Optimal coupling of the selected wavelength light into fiber 160, while excluding the spontaneous emission components, is provided by controller 168 according to feedback from detector 166 as described above.

Figure 8:
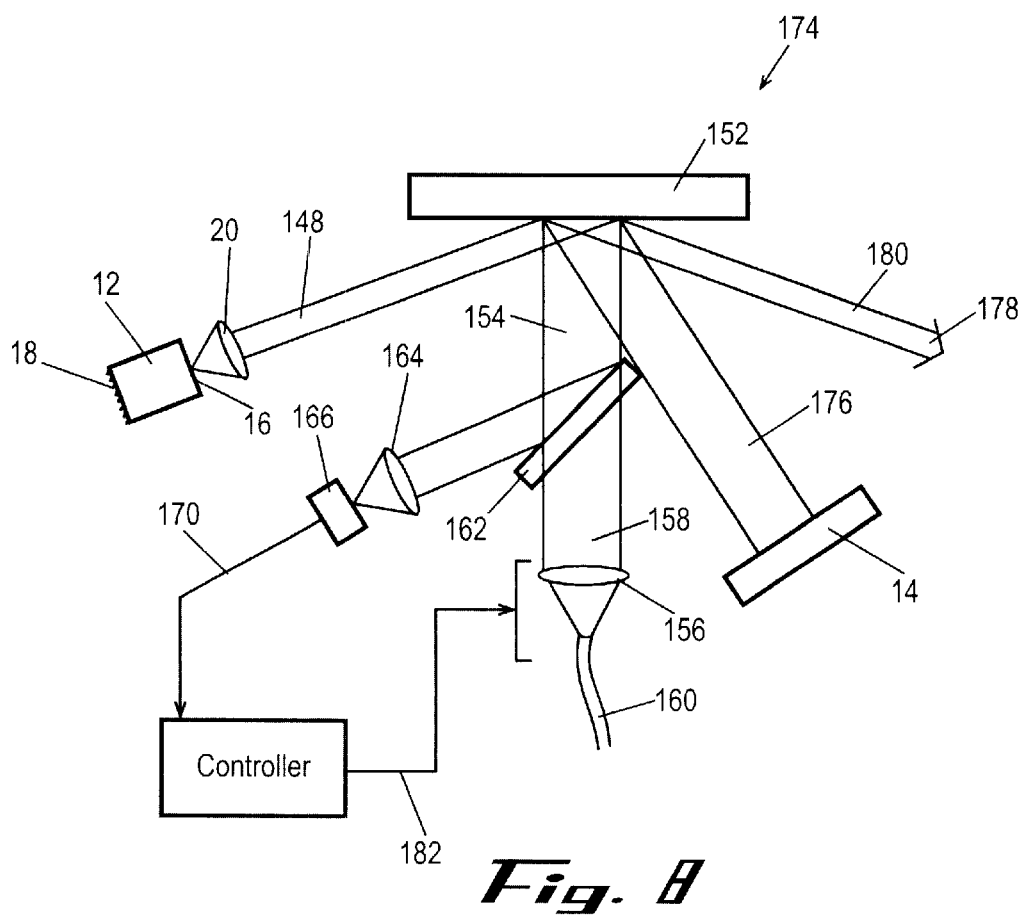
FIG. 8 is a schematic illustration of another embodiment of an external cavity laser apparatus using the control system of FIG. 7.

Referring now to FIG. 8, there is shown another embodiment of a laser apparatus 174 in accordance with the invention, with like reference numbers used to denote like parts. In the apparatus 174, a gain medium 12 is provided to emit an input beam 148 towards grating 152. A reflector or mirror 14 is positioned to receive a diffraction of beam 148 along path 176, and return this diffraction along path 176 to gain medium 12. Reflector 14 and rear facet 18 of gain medium 12 define an external laser cavity, with reflector 14 movable with respect to grating 152 to select the wavelength fed back to gain medium 12 as described above. Detector 166 is operatively coupled to controller 168 via interface 170. The apparatus 174 provides a conventional output beam 178 as the reflection of input beam 148 off grating 152 along output path 180.

In the embodiment of FIG. 8, controller 168 is operatively coupled by interface 182 to the fiber coupling assembly 184 defined by lens 156 and fiber 160. The fiber coupling assembly 184 may include an optical isolator and/or other components (not shown) that are commonly used for coupling laser output into an optical fiber. Interface 182 comprises conventional translation hardware (not shown) that is configured to re-position or re-orient fiber coupling assembly 184 according to instruction from controller 168.

In this embodiment, a diffraction that is of a different order than the diffraction directed to reflector 14, is directed along path 154 and coupled into fiber 160. For example, the first order diffraction of beam 148 off grating 152 may be reflected off reflector 14 and returned to gain medium 12 as tunable feedback, while the second order or a higher order diffraction of beam 148 is directed along path 154 as an output beam 158 for coupling into fiber 160. Movement of reflector 14 to change the selected wavelength fed back to gain medium 12 results in re-orientation of the diffraction traveling output path 158. This change is detected by detector 166 according to the position of a focused beam spot with respect to the detector center as described above. The resulting error signal is used by controller 168 to re-orient the fiber coupling assembly 184 to optimally receive the diffraction traveling output path 154 and couple this diffraction into fiber 160 as an SSE and ASE-filtered output 158. Controller 170 may additionally, or alternatively, be operatively coupled to grating 152 and configured to reposition grating 152 according to the detected position of the focused beam spot on detector 166 as described above.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A laser apparatus, comprising:
   (a) a gain medium emitting a light beam along an optical path;
   (b) a tuning element positioned in said optical path and configured feed back light of a selected wavelength to said gain medium, said tuning element configured to define a first output beam directed along a first output path;
   (c) a partial reflector located in said optical path and positioned to create a second output beam from light directed to said partial reflector from said tuning element, said second output beam directed along a second output path parallel to said first output path; and
   (d) said second output beam having a spontaneous emission component that is spatially separated from said selected wavelength.

2. The laser apparatus of claim 1, further comprising an optical fiber positioned with respect to said second output path such that light at said selected wavelength is selectively received by said optical fiber.

3. The laser apparatus of claim 1, further comprising a reflector positioned in said optical path after said tuning element, said reflector and a rear facet of said gain medium defining an external laser cavity.

4. The laser apparatus of claim 3, wherein said reflector is movable with respect to said tuning element, said reflector and said tuning element operable to define said selected wavelength.

5. The laser apparatus of claim 1, further comprising a beam coupler, said partial reflector positioned on a facet of said beam coupler.

6. The laser apparatus of claim 5, wherein said beam coupler includes an antireflection coating on a facet opposite from said partial reflector.

7. The laser apparatus of claim 5, wherein said beam coupler is configured to define a third output beam along a third output path, said third output path parallel to said first and second output paths.

8. The laser apparatus of claim 1, wherein said tuning element comprises a grating.

9. The laser apparatus of claim 1, wherein said tuning element comprises an etalon.

10. The laser apparatus of claim 1, wherein said partial reflector is positioned in said optical path before said tuning element.

11. The laser apparatus of claim 1, further comprising:
   (a) a second tuning element positioned in one of said first and second output paths and configured to direct a third output beam from said second tuning element along a third output path, said third output beam having a spontaneous emission component that is spatially separated from said selected wavelength;
   (b) a detector positioned to detect positioning of said third output path; and
   (c) a controller operatively coupled to said detector, said controller configured to position said second tuning element according to detected said positioning of said third output path.

12. A laser apparatus, comprising:
   (a) a gain medium having first and second facets, said gain medium emitting a light beam from said first facet along an optical path;
   (b) a reflector positioned in said optical path, said reflector and said second facet of said gain medium defining an external laser cavity;

(c) a tuning element positioned in said optical path and configured feed back light of a selected wavelength to said gain medium, said tuning element defining a first output beam traveling a first output path;

(d) a beam coupler positioned in said optical path and configured to create a second output beam from light directed from said tuning element to said beam coupler, said second output beam traveling along a second output path that is parallel to said first output path; and (e) said second output beam having a spontaneous emission component that is spatially separated from said selected wavelength by operation of said tuning element on said second output beam.

13. The laser apparatus of claim 12, further comprising an optical fiber positioned with respect to said second output path such that light at said selected wavelength is selectively received by said optical fiber.

14. The laser apparatus of claim 12, wherein said beam coupler includes a partially reflective surface positioned to define said second output beam and said second output path.

15. The laser apparatus of claim 14, wherein said beam coupler includes an antireflective coating on a facet opposite said partially reflective surface.

16. The laser apparatus of claim 14, wherein said beam coupler is configured to define a third output beam along a third output path, said third output path parallel to said first and second output paths.

17. The laser apparatus of claim 16, wherein said beam coupler includes a second partially reflective surface positioned to define said third output beam and said third output path.

18. The laser apparatus of claim 12, wherein said reflector is movable with respect to said tuning element, said reflector and said tuning element operable to define said selected wavelength.

19. The laser apparatus of claim 12, wherein said beam coupler is positioned in said optical path before said tuning element.

20. The laser apparatus of claim 12, wherein said tuning element comprises a grating.

21. The laser apparatus of claim 12, wherein said tuning element comprises an etalon.

22. The laser apparatus of claim 12, further comprising:

(a) a second tuning element positioned in one of said first and second output paths and configured to direct a third output beam from said second tuning element along a third output path, said third output beam having a spontaneous emission component that is spatially separated from said selected wavelength;

(b) a detector positioned to detect positioning of said third output path; and (c) a controller operatively coupled to said detector, said controller configured to position said second tuning element according to detected said positioning of said third output path.

23. The laser apparatus of claim 22, further comprising an optical fiber positioned with respect to said third output path such that light at said selected wavelength is selectively received by said optical fiber.

24. A method for laser operation, comprising:

(a) emitting a light beam from a gain medium along an optical path;

(b) feeding light of a selected wavelength back to said gain medium by a tuning element positioned in said optical path;

(c) creating a first output beam by said tuning element, said first output beam directed along a first output path;

(d) creating a second output beam by a partial reflector positioned in said optical path to receive light of said selected wavelength from said tuning element, said second output beam directed along a second output path parallel to said first output path; and (e) spatially separating spontaneous emission light from light of said selected wavelength in said second output beam.

25. The method of claim 24, further comprising coupling said second output beam into an optical fiber, said optical fiber positioned to selectively receive said selected wavelength.

26. The method of claim 24, further comprising positioning said partial mirror in said optical path before said tuning element.

27. The method of claim 24, further comprising defining an external laser cavity by placing a reflector in said optical path after said tuning element, said external cavity defined by said reflector and a facet of said gain medium.

28. The method of claim 27, further comprising moving said reflector with respect to said tuning element to define said selected wavelength.

29. The method of claim 24, further comprising positioning a beam coupler in said optical path, said partial reflector located on a facet of said beam coupler.

30. The method of claim 29, further comprising creating a third output beam by said beam coupler, said third output beam traveling along a third output path parallel to said first and second output paths.

31. The method of claim 29, further comprising providing an antireflective coating on a facet of said beam coupler located opposite said partial reflector.

32. The method of claim 24, wherein said tuning element comprises a grating.

33. The method of claim 24, wherein said tuning element comprises an etalon.

34. A method for laser operation, comprising:

(a) providing a reflector and a gain medium having front and rear facets, said reflector and said rear facet defining an external laser cavity;

(b) emitting a light beam from said front facet of said gain medium along an optical path, said reflector positioned in said optical path (c) positioning a tuning element in said optical path;

(d) creating a first output beam that exits said external laser cavity along a first output path;

(e) creating a second output beam that exits said external laser cavity along a second output path parallel to said first output path; and (f) spatially separating spontaneous emission light from light of said selected wavelength in said second output beam.

35. The method of claim 34, further comprising coupling said second output beam into an optical fiber, said optical fiber positioned to selectively receive said selected wavelength and exclude said spontaneous emission light.

36. The method of claim 34, further comprising positioning a partial mirror in said optical path, said partial mirror directing said second output beam along said second output path.

37. The method of claim 34, further comprising positioning a beam coupler in said optical path, said partial reflector located on a facet of said beam coupler.

38. The method of claim 37, further comprising a creating a third output beam by said beam coupler, said third output beam traveling along a third output path parallel to said first and second output paths.

39. The method of claim 37, further comprising providing an antireflective coating on a facet of said beam coupler located opposite said partial reflector.

40. The method of claim 34, wherein said tuning element comprises a grating.

41. The method of claim 34, wherein said tuning element comprises an etalon.

42. The method of claim 34, further comprising moving said reflector with respect to said tuning element to define said selected wavelength.

43. A laser apparatus, comprising:

(a) means for emitting a light beam along an optical path;

(b) tuning means for feeding light of a selected wavelength back to said emitting means;

(c) means for forming a first output beam and directing said first output beam along a first output path;

(d) means for forming a second output beam from light of said selected wavelength and directing said second output beam along a second output path parallel to said first output path; and (e) means for spatially separating spontaneous emission light from light of said selected wavelength in said second output beam.

44. The laser apparatus of claim 43, further comprising optical coupling means for selectively directing said light from said selected wavelength in said second output beam.

45. The laser apparatus of claim 43, wherein said means for forming said second output beam comprise beam coupler means, positioned in said optical path, for receiving light from said tuning means and reflecting said light from said tuning means along said second output path.

* * * * *